United States Patent
Masuda et al.

(10) Patent No.: US 9,145,605 B2
(45) Date of Patent: Sep. 29, 2015

(54) THIN-FILM FORMING METHOD AND THIN-FILM FORMING APPARATUS

(75) Inventors: Takeshi Masuda, Shizuoka (JP);
Takuya Ideno, Shizuoka (JP);
Masahiko Kajinuma, Shizuoka (JP);
Nobuhiro Odajima, Shizuoka (JP);
Yohei Uchida, Shizuoka (JP); Koukou Suu, Shizuoka (JP)

(73) Assignee: Ulvac, Inc., Kanagawa (JP)

( * ) Notice: Subject to any disclaimer, the term of this patent is extended or adjusted under 35 U.S.C. 154(b) by 28 days.

(21) Appl. No.: 13/876,756

(22) PCT Filed: Sep. 15, 2011

(86) PCT No.: PCT/JP2011/005208
§ 371 (c)(1),
(2), (4) Date: May 7, 2013

(87) PCT Pub. No.: WO2012/042772
PCT Pub. Date: Apr. 5, 2012

(65) Prior Publication Data
US 2013/0224381 A1    Aug. 29, 2013

(30) Foreign Application Priority Data
Sep. 29, 2010  (JP) ................................. 2010-219225

(51) Int. Cl.
*C23C 16/02* (2006.01)
*C23C 16/18* (2006.01)
(Continued)

(52) U.S. Cl.
CPC ............ *C23C 16/44* (2013.01); *C23C 16/4401* (2013.01); *H01L 21/02197* (2013.01); *H01L 21/02271* (2013.01)

(58) Field of Classification Search
CPC .......... C23C 16/02; C23C 16/18; C23C 16/44
USPC .......................... 427/255.21, 255.6
See application file for complete search history.

(56) References Cited

U.S. PATENT DOCUMENTS 4,411,729 A * 10/1983 Komeno .................... 117/93
2004/0166598 A1 * 8/2004 Miya et al. .................. 438/9
(Continued)

FOREIGN PATENT DOCUMENTS

JP  2002-343727     * 11/2002
JP  2003-309077 A    10/2003
(Continued)

OTHER PUBLICATIONS

Frohlich, K., et al., "Superconducting YBa2Cu3O7 films prepared by aerosol metal organic chemical vapour deposition on Al2O3 substrate with CeO2 buffer layer". Supercond. Sci. Technol. 10 (1997) 657-662.*

(Continued)

*Primary Examiner* — Bret Chen
(74) *Attorney, Agent, or Firm* — Saliwanchik, Lloyd & Eisenschenk (57) ABSTRACT

A thin film manufacturing method and a thin film manufacturing apparatus are provided to manufacture a thin film with good reproducibility. A dummy substrate is conveyed into a chamber, and a dummy processing gas is supplied to the dummy substrate. Moreover, a product substrate is conveyed into the chamber, and a raw material gas different from the dummy processing gas is supplied to the product substrate. The raw material gas contains metal material for manufacturing a thin film with a metal organic chemical vapor deposition (MOCVD) method. Since the raw material gas is not used as a dummy processing gas, the amount of metal material to be used can be minimized in manufacturing the thin film with good reproducibility.

8 Claims, 9 Drawing Sheets (51) Int. Cl.
*C23C 16/44* (2006.01)
*H01L 21/02* (2006.01)

(56) References Cited

U.S. PATENT DOCUMENTS

| | | | |
|---|---|---|---|
| 2005/0059246 A1 | 3/2005 | Yamada et al. | |
| 2005/0118737 A1 | 6/2005 | Takagi et al. | |
| 2006/0110944 A1* | 5/2006 | Kesteren | 438/795 |
| 2007/0160756 A1* | 7/2007 | Treichel | 427/248.1 |
| 2007/0178669 A1* | 8/2007 | Noda et al. | 438/478 |
| 2008/0171142 A1* | 7/2008 | Matsumoto et al. | 427/126.3 |
| 2008/0305633 A1 | 12/2008 | Itatani et al. | |
| 2009/0061092 A1 | 3/2009 | Kameshima et al. | |
| 2011/0147763 A1* | 6/2011 | Hanawa et al. | 257/76 |
| 2013/0005118 A1* | 1/2013 | Jun et al. | 438/478 |

FOREIGN PATENT DOCUMENTS

| | | |
|---|---|---|
| JP | 2004-079985 A | 3/2004 |
| JP | 2004-193396 A | 7/2004 |
| JP | 2005-054253 A | 3/2005 |
| JP | 2006-222318 A | 8/2006 |

OTHER PUBLICATIONS

Jurgensen, Holger, "Low pressure MOCVD of uniform InP/GaInAs and GaInAsP superlattice structures and quantum wells for optoelectronic applications." SPIE vol. 861 Quantum Wells and Superlattices in Optoelectronic Devices and Integrated Optics (1987), pp. 130-133.*
Liang, Junsheng, et al., "Novel Flow Field with Superhydrophobic Gas Channels Prepared by One-step Solvent-induced Crystallization for Micro Direct Methanol Fuel Cell". Nano-Micro Lett. (2015) 7(2):165-171.*
International Search Report in International Appplication No. PCT/JP2011/005208, filed Sep. 15, 2011.
Office Action dated Jul. 28, 2014 in Korean Application No. 10-2013-7007215.
European Search Report dated Jul. 17, 2014 in European Application No. 11828339.9.
Office Action dated Feb. 15, 2015 in Chinese Application No. 20118004070.3.

* cited by examiner

| | Reproducibility (±%) |
|---|---|
| Pb/(Zr+Ti) | 1.11 |
| Zr/(Zr+Ti) | 2.14 |
| Depo. Rate | 2.73 |

| | Reproducibility (±%) |
|---|---|
| Pb/(Zr+Ti) | 0.59 |
| Zr/(Zr+Ti) | 2.23 |
| Depo. Rate | 0.94 |

|  | Reproducibility (±%) |
|---|---|
| Pb/(Zr+Ti) | 0.41 |
| Zr/(Zr+Ti) | 2.13 |
| Depo. Rate | 0.87 |

THIN-FILM FORMING METHOD AND THIN-FILM FORMING APPARATUS

CROSS-REFERENCE TO RELATED APPLICATIONS

This application is the U.S. national stage application of International Patent Application No. PCT/JP2011/005208, filed Sep. 15, 2011, which claims priority to Japanese Application No. 2010-219225, filed Sep. 29, 2010, the disclosures of each of which are incorporated herein by reference in their entirety.

TECHNICAL FIELD

The present invention relates to a method of forming a thin-film by a Metal Organic Chemical Vapor Deposition (MOCVD) method, and a thin-film forming apparatus.

BACKGROUND ART

In the related art, the MOCVD method for forming a thin-film by reacting an organic metal raw material gas with a reaction gas at a high temperature is known. For example, Patent Document 1 describes a film forming method and a film forming apparatus for forming a PZT (lead zirconate titanate) thin-film by the MOCVD method.

In the film forming method described in Patent Document 1, when the film forming process is started after idling of the film forming apparatus, a PZT thin-film is formed on a dummy wafer that is not a product. After the dummy film forming method are repeated for at least 3 times using the dummy wafers, the PZT thin-film is formed on the product wafer, hi this way, a film forming reproducibility of the PZT thin-film formed on the product wafer is improved (see paragraphs [0019] and [0020] in Patent Document 1.

Patent Document 1: Japanese Patent Application Laid-open No. 2006-222318

SUMMARY OF INVENTION

Problem to be Solved by the Invention

However, in the film forming method described in Patent Document 1, the PZT thin-film is firstly formed on the dummy wafer that is not a product. A consumption amount of each of Pb, Zr and Ti that is a raw material of the PZT thin-film increases. It is therefore difficult to save the resources. Also, the costs for each metal raw material increase.

In view of the circumstances as described above, an object of the present invention is to provide a thin-film forming method and a thin-film forming apparatus, both of which enable the formation of a thin-film by saving the resources with a good reproducibility at low costs.

Means for Solving the Problem

In order to achieve the above-mentioned object, a method of forming a thin-film according to an embodiment of the present invention includes transporting a dummy substrate to a chamber, and supplying the dummy substrate with a gas for treating a dummy.

A product substrate is transported to the chamber, and the product substrate is supplied with a raw material gas containing a metal raw material for forming a thin-film by the MOCVD (Metal Organic Chemical Vapor Deposition) method; the raw material as being different from the gas for treating the dummy.

A thin-film forming apparatus according to an embodiment of the present invention includes a chamber, a supply mechanism and a controlling means.

To the chamber, each of a dummy substrate and a product substrate is transported.

The supply mechanism is to supply the chamber with the gas for treating the dummy and the raw material gas for forming a film by the Metal Organic Chemical Vapor Deposition (MOCVD) method; the mixed gas being different from the gas for treating the dummy and containing the metal raw material.

The controlling means is to supply the chamber with the gas for treating the dummy when the dummy substrate is transported to the chamber, and to supply the chamber with the raw material gas when the product substrate is transported to the chamber in place of the dummy substrate.

MODE(S) FOR CARRYING OUT THE INVENTION

A method of forming a thin-film according to an embodiment of the present invention includes transporting a dummy substrate to a chamber, and supplying the dummy substrate with a gas for treating a dummy.

A product substrate is transported to the chamber, and the product substrate is supplied with a raw material gas containing a metal raw material for forming a thin-film by the MOCVD (Metal Organic Chemical Vapor Deposition) method; the raw material gas being different from the gas for treating the dummy.

According to the thin-film forming method, before the product substrate is supplied with the raw material gas containing the metal raw material, the dummy substrate is supplied with the gas for treating the dummy being different from the raw material gas. It is thus possible to satisfy the film forming conditions in the environmental of the chamber. As a result, a thin-film can be formed by saving the resources with good reproducibility at low costs.

The chamber may be idled, i.e., the film may not be formed, by disposing an idle substrate before the dummy substrate is transported to the chamber and the dummy substrate is supplied with the gas for treating the dummy.

The raw material gas contains a solvent gas for dissolving the metal raw material at room temperature and normal pressure and an inert gas used as a carrier gas, for example.

In the steps of supplying the raw material gas, the product substrate is supplied with a mixed gas of the raw material gas, a reaction gas for reacting with the raw material gas, and an inert gas.

The gas for treating the dummy may be provided by mixing the solvent gas tier dissolving the metal raw material, the reaction gas, and the inert gas.

In the thin-film forming method, as the gas for treating the dummy, the mixed gas is used; the mixed gas being obtained by mixing the solvent gas for dissolving the metal raw material at room temperature and normal pressure, the reaction gas, and the inert gas used in the film forming method. In other words, as the gas for treating the dummy, the raw material gas containing the metal raw material is not used. Therefore, a thin-film can be formed by saying the resources with good reproducibility at low costs. In addition, the mixed gas may contain the inert gas as the carrier gas.

The gas for treating the dummy may be obtained by mixing the solvent gas for dissolving the metal raw material with the inert gas.

In this way, as the gas for treating the dummy, the mixed gas may be used; the mixed gas being obtained by mixing the solvent gas for dissolving the metal raw material at room temperature and normal pressure with the inert gas. The mixed gas may contain the inert gas used as the carrier gas.

The gas for treating the dummy may be the inert gas.

In this way, as the gas for treating the dummy, only the inert gas may be used.

In the step of supplying the raw material gas, the mixed gas containing the raw material gas and the reaction gas for reacting with the raw material gas may be supplied to the product substrate.

The gas for treating the dummy may be the mixed gas of the solvent gas for dissolving the metal raw material and the reaction gas.

The gas for treating the dummy may be the reaction gas. In this way, as the gas for treating the dummy, only the reaction gas may be used.

A thin-film forming apparatus according to an embodiment of the present invention includes a chamber, a supply mechanism and a controlling means.

To the chamber, a dummy substrate and a product substrate are transported.

The supply mechanism is to supply the chamber with the gas for treating the dummy and the raw material gas for forming a film by the Metal Organic Chemical Vapor Deposition (MOCVD) method; the mixed gas being different from the gas for treating the dummy and containing the metal raw material.

The controlling means is to supply the chamber with the gas for treating the dummy when the dummy substrate is transported to the chamber, and to supply the chamber with the raw material gas when the product substrate is transported to the chamber in place of the dummy substrate.

Hereinafter, embodiments according to the present invention be described with reference to the drawings.

Thin-Film Forming Apparatus

Figure 1:
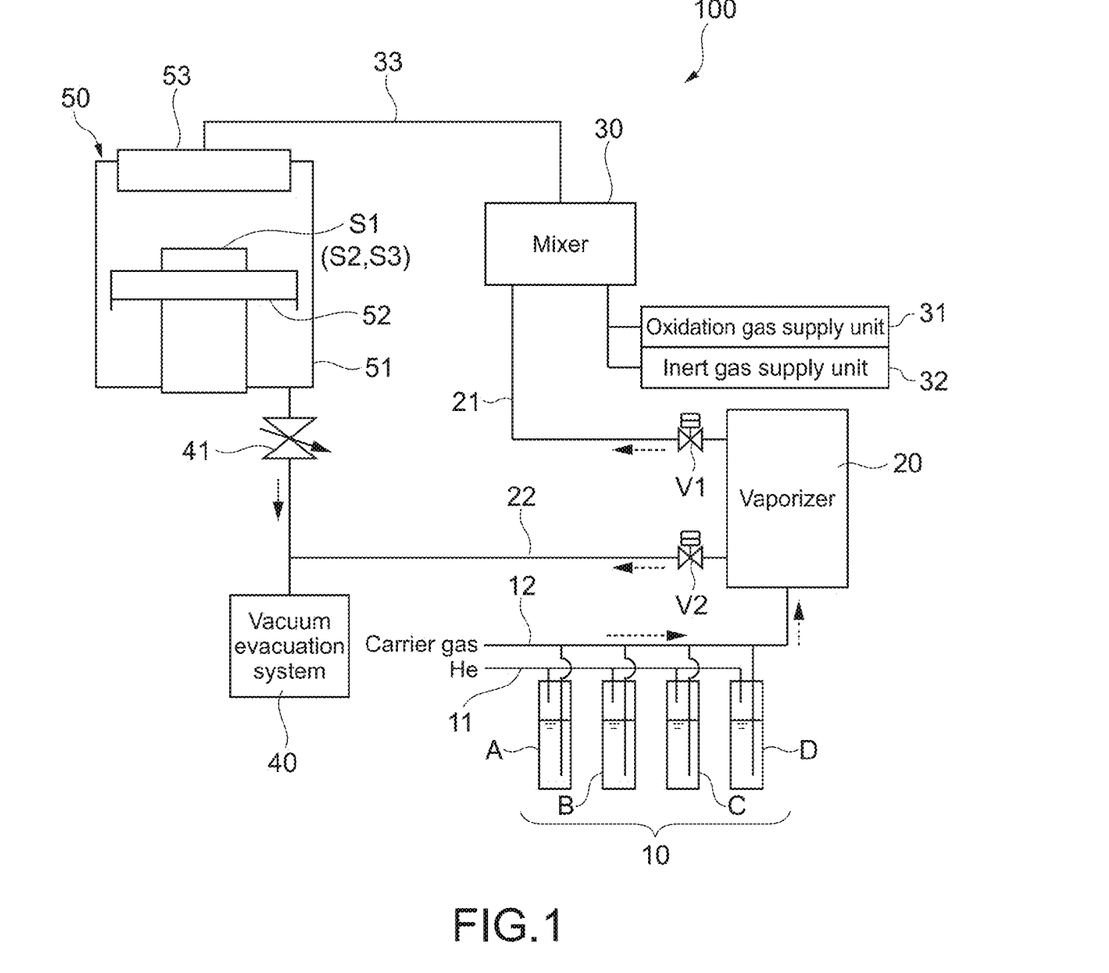
FIG. 1 A schematic diagram showing a configuration of a thin-film forming apparatus according to an embodiment of the present invention.

FIG. 1 is a schematic diagram showing a configuration of a thin-film forming apparatus according to an embodiment of the present invention. The thin-film forming apparatus according to the embodiment allows a ferroelectric PZT thin-film to be formed using the MOCVD method.

A thin-film forming apparatus 100 includes a raw material supply unit 10 for supplying an organic solvent solution of an organic metal, and a vaporizer 20 for vaporizing the solution to produce a raw material gas. The thin-film forming apparatus 100 includes a mixer 30 for producing a mixed gas by mixing a raw material gas, an oxidation gas that is reacted with the raw material, and an inert gas, and a film forming chamber 50 connected to the mixer 30 via a supply line 33 as a supply path. According to the embodiment, the supply mechanism is configured by the raw material supply unit 10, the vaporizer 20, the mixer 30 and each line and each valve disposed thereon.

The raw material supply unit 10 includes tanks A, B, C and D with which a raw material solution and a solvent of the organic metal is filed, and a supply line 11 for supplying He (helium) to respective tanks (A to D). Also, the raw material supply unit 10 includes a supply line 12 for supplying a carrier gas to transport the solution and the solvent of the metal raw material forced out by a pressure of He supplied to the respective tanks A to D. In the embodiment, $N_2$ (nitrogen) is used as a carrier gas, but is not limited thereto. Other inert gas may be used. In the same manner, the gas supplied to the respective tanks A to D is not limited to He, and other inert gas may be used.

In the embodiment, the tanks A to D are filled with a Pb raw material solution, a Zr raw material solution, a Ti raw material solution and an organic solvent, respectively. As the Ph, Zr and Ti raw material solutions, each metal raw material is dissolved in an n-butyl acetate solution at a concentration of 0.25 mol/L. In the embodiment, each metal raw material is dissolved in the solvent at room temperature and normal pressure.

As the Pb raw material, $Pb(dpm)_2$, methanate) lead is used. As the Zr raw material, $Zr(dmhd)_4$, (tetrakis(2,6)dimethyl(3,5)heptane dionate)zirconium is used. As the Ti raw material, $Ti(iPrO)_2(dpm)_2$, ((bisisopropoxide)bisdipivaloyl methanate)) titanium is used. As the solvent filled in the tank D, n-butyl acetate is used. $Pb(dpm)_2$ is also referred to as $Pb(thd)_2$, (bis(2,2,6,6)tetramethyl(3,5)heptanedionate) lead.

The metal raw materials dissolved into the solvent are not limited to the above-described materials. For example, the Pb raw material may include $Pb(dibm)_2$, (bisdiisobutyryl methanate) lead, or may partly include both of $Pb(dpm)_2$ and $Pb(dibm)_2$ or at least one of them. The Zr raw material may include $Zr(thd)_4$, (tetrakis(2,2,6,6)tetramethyl(3,5)heptane dionate)zirconium, or may partly include it. The Ti raw material may include $Ti(MMP)_4$, (tetrakis(1)methoxy(2)methyl(2) propoxy) titanium, or may partly include it.

As the solvent for dissolving each metal raw material and a solvent filled in the tank D, toluene, tetrahydrofuran (THE), cyclohexane, ethylcyclohexane, methylcyclohexane or the like may be used instead of n-butyl acetate as described above.

The vaporizer 20 is connected to the raw material supply unit 10 via the supply line 12, and droplets of the metal raw material solution and the solvent are transported from the raw material supply unit 10 to the vaporizer 20. The vaporizer 20 includes a heating means (not shown), which vaporizes the solution and the solvent of the metal raw material transported. In this way, a metal raw material gas is produced. In order to improve vaporization efficiency, a gas, ultrasonic, etc. may be applied to the droplets of the metal raw material solution and the solvent, or the droplets that have become finer via a fine nozzle in advance may be introduced. In addition, the raw material as contains the solvent gas, the inert gas used as the carrier gas and the like.

As shown in FIG. 1, the vaporizer 20 includes a Run line 21 connected to the mixer 30, and a Vent line 22 connected to a vacuum evacuation system 40. A valve $V_1$ is disposed in the Run line 21, and a valve $V_2$ is disposed in the Vent line 22.

The mixer 30 produces the mixed gas of the metal raw material gas produced by the vaporizer 20, the oxidation gas, and the inert gas. Accordingly, an oxidation gas supply unit 31 and an inert gas supply unit 32 are connected to the mixer 30. In the embodiment, $O_2$ (oxygen) is supplied from the oxidation gas supply unit 31, and $N_2$ is supplied from the inert gas supply unit 32. However, as the oxidation gas, dinitrogen monoxide, ozone etc. may be supplied. Also, as the inert gas, argon etc. may be supplied.

The film forming chamber 50 includes a chamber 51 connected to the supply line 33 and a stage 52 disposed in the chamber 51. A shower nozzle 53 is disposed on a ceiling plane of the chamber 51. To the shower nozzle 53, the supply line 33 is connected. The stage 52 and the shower nozzle 53 are disposed facing each other. In the chamber 51, cleaned parts such as a shield (not shown) are disposed.

As shown in FIG. 1, on the stage 52, the idle substrate $S_1$, the dummy substrate $S_2$ and the product substrate $S_3$ are placed. The stage 52 has a temperature sensor such as a heater (not shown) and a thermocouple, and can heat each of the idle substrate $S_1$, the dummy substrate $S_2$ and the product substrate $S_3$ placed. A heating means for heating each of the idle substrate $S_1$, the dummy substrate $S_2$ and the product substrate $S_3$ is not limited to the heater, but various heating means can be employed.

As described later, an idle substrate $S_1$ is used for idling. A dummy substrate $S_2$ is used for treating the dummy. A product substrate $S_3$ is used for forming the PZT thin-film by the film formation. According to the embodiment, as the idle substrate $S_1$, the dummy substrate $S_2$, and the product substrate $S_3$, the same substrate is used. Specifically, the substrate is configured of an 8-inch Si substrate on which an $SiO_2$ oxidized film is formed in a thickness of 100 nm, and Ir is formed thereon in a thickness of 70 nm by a sputtering method. However, the size, the material and the like of the substrate are not limited.

The chamber 51 is connected to the vacuum evacuation system 40 including, for example, a dry pump, a turbo molecular pump etc. via a pressure adjusting valve 41. By setting a pressure in the chamber 51 with the pressure adjusting valve 41 as appropriate, it is possible to easily accommodate a variety of film forming pressure conditions.

Each apparatus including each line from the vaporizer 20 to the film forming chamber 50, each valve, the mixer 30 etc. is kept at a high temperature, e.g. 200° C. or more, by the heating means (not shown) such that the metal raw material gas vaporized is not liquefied, for example.

The thin-film forming apparatus 100 according to the embodiment includes a controlling unit (not shown) as a controlling means for controlling each valve and each apparatus as described above. The controlling unit includes a main memory including a CPU (Central Processing Unit), a ROM ((dead Only Memory) or a RAM (Random Access Memory) or the like. A controlling signal is output from the controlling unit to each apparatus via, for example, wired or wireless, thereby controlling a gas flow to the chamber 51, heating of respective substrates $S_1$ to $S_3$ mounted on the stage 52, and the like.

Multichamber Film Forming Apparatus

Figure 2:
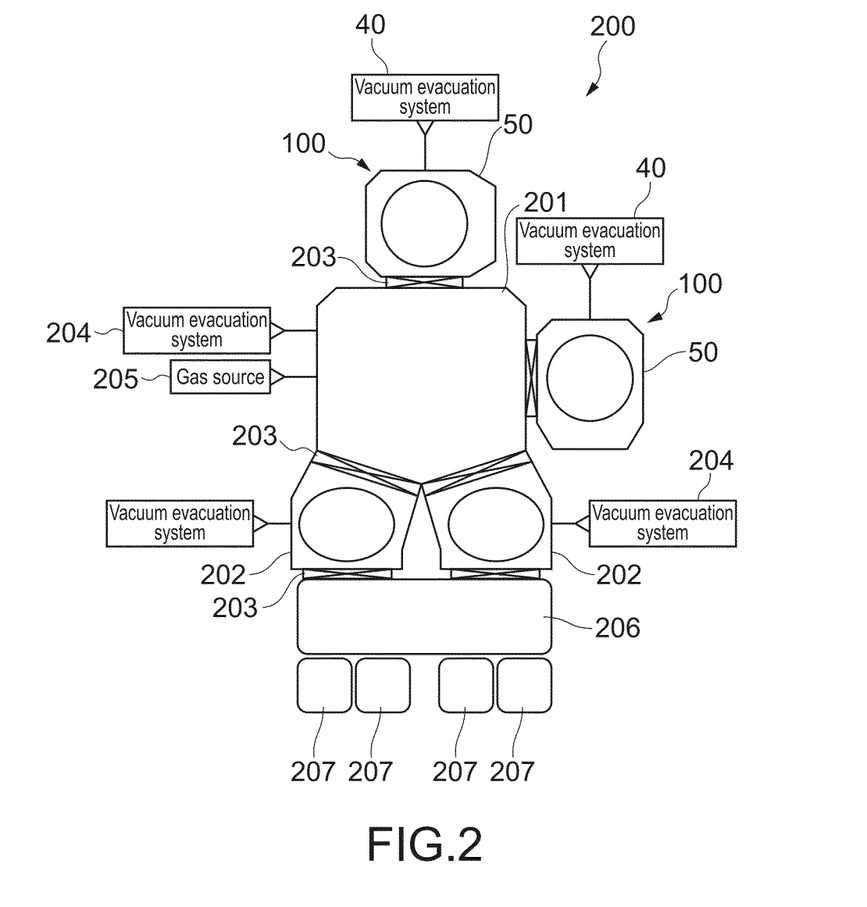
FIG. 2 A schematic diagram showing a configuration of a multichamber film forming apparatus including the thin-film forming apparatus shown in FIG. 1.

FIG. 2 is a schematic diagram showing a configuration of a multichamber film forming apparatus including the thin-film forming apparatus 100 according to the embodiment. A multichamber film forming apparatus 200 includes a transport chamber 201 on which a transport robot (not shown) capable of transporting each of substrates $S_1$, $S_2$ and $S_3$ is placed, and two stock chambers 202 capable of each mounting 25 substrates as a lot. The multichamber film forming apparatus 200 includes two thin-film forming apparatuses 100 as described above, and two film forming chambers 50 are disposed around the transport chamber 201. Each of the film forming chambers 50 and the stock chambers 202 is connected to the transport chamber 201 via a partition valve 203. The number of the stock chambers 202 is not limited to two. More stock chambers or one stock chambers may be disposed around the transport chamber 201.

Each vacuum evacuation system 40 is connected to each film forming chamber 50. Similarly, a vacuum evacuation system 204 is connected to each of the transport chamber 201 and the stock chambers 202. Each chamber can be evacuated inside independently to a vacuum atmosphere. Alternatively, one vacuum evacuation system may be simultaneously used for the transport chamber 201, the film forming chamber 50, and the stock chambers 202 to evacuate inside, for example. In this case, the vacuum evacuation system functions as the vacuum evacuation system 40 as shown in FIG. 1.

A gas source 205 is connected to the transport chamber 201. With a pressure adjusted gas such as the inert gas introduced from the gas source 205, the transport chamber 201 can be adjusted to have a predetermined pressure. An automatic pressure adjusting valve (not shown) disposed at the transport chamber 201 adjusts an internal pressure of the transport chamber 201.

As shown in FIG. 2, the stock chambers 202 are connected to a substrate transport system under atmosphere 206 via valves 203. The substrate transport system under atmosphere 206 includes a transport robot (not shown) for transporting the substrate $S_3$ and the like on which a film is formed or not between a plurality of wafer cassettes 207 and the stock chambers 202.

The multichamber film forming apparatus 200 according to the embodiment includes two stock chambers 202. When one stock chamber 202 is filled with the substrates, the other stock chamber 202 can mount the substrates. If the substrates are mounted on the second stock chamber 202, the second stock chamber 202 is vacuum evacuated after the film forming process of the substrates mounted on the first stock chamber 202 is ended, and the substrates are again transported to the film forming chamber 50.

Figure 3:
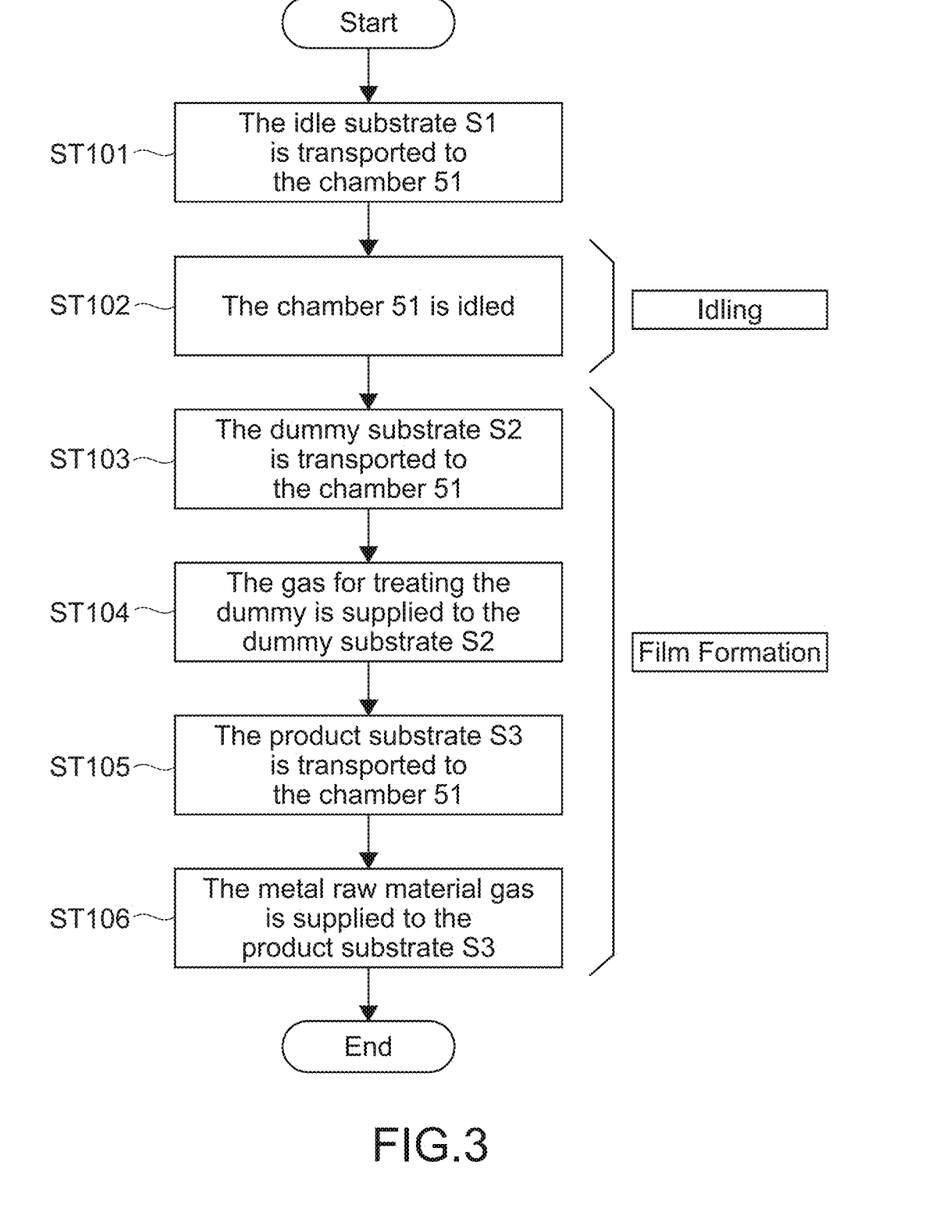
FIG. 3 A flow chart for showing operations of the thin-film forming apparatus and the multichamber film forming apparatus shown in FIGS. 1 and 2.

Operations of Thin-film Forming Apparatus and Multichamber Film Forming Apparatus FIG. 3 is a flow chart for showing operations of the thin-film forming apparatus 100 and the multichamber film firming apparatus 200 according to the embodiment. FIG. 3 shows the operations of idling the chamber 51, restarting the film formation, and forming the PZT thin-film on the product substrate $S_3$. The idling refers to the interruption of the film formation. In other words, the film formation is not performed in the chamber 51.

The idle substrate $S_1$ is transported from the transport chamber 201 of the multichamber film forming apparatus 200 to the chamber 51 (step 101). The idle substrate $S_1$ may be selected from a plurality of substrates mounted on the stock chambers 202 in the film formation before the interruption. Alternatively, the idle substrate $S_1$ may be separately prepared and transported to the chamber 51.

While the idle substrate $S_1$ is disposed in the chamber 51, the chamber 51 is idled. (step 102). Under the idling, the environment of the chamber 51 is adjusted to approach the environment where the film forming conditions in the film formation restarted later are satisfied.

According to the embodiment, the internal pressure of the chamber 51 idled is adjusted to about 2 Torr, which is included in the film forming pressure conditions. The internal pressure of the chamber 51 is adjusted by $N_2$ supplied from the inert gas supply unit 32 as shown in FIG. 1.

In the film formation, a heater included in the stage 52 of the chamber 51 heats the product substrate $S_3$ at 600° C. or more. The heat from the heater is transmitted to the shower nozzle 53 or other parts. As described above, as the metal Ir is formed on the product substrate $S_3$, a part of the heat from the heater is reflected by Ir. In other words, a status of heat dissipation from the heater to other parts is affected by the product substrate $S_3$ mounted on the stage 52.

In view of the above, according to the embodiment, the idle substrate $S_1$ that is also the product substrate $S_3$ is mounted on the stage 52 in the chamber 51 and heated to 600° C. or more. In this way, the temperature environment in the chamber 51 idled can be close to the temperature environment that satisfies the film forming conditions.

In the embodiment, as the idle substrate $S_1$, the same substrate as the product substrate $S_3$ is used. However, if the metal is formed and the temperature environment of the chamber 51 idled can be adjusted as described above, the substrate being different from the product substrate $S_3$ may be used as the product substrate $S_1$. The above-described film forming pressure conditions and the heating temperature of the idle substrate $S_1$ and the product substrate $S_3$ may be set as appropriate.

While the chamber 51 of the thin-film forming apparatus 100 is idled, the film formation is restarted. In this way, a predetermined number of substrates are transported from the wafer cassettes 207 including 25 substrates to the stock chambers 202 by the transport robot disposed in the substrate transport system under atmosphere 206. First two substrates of the plurality of substrates transported to the chamber 51 are used as the dummy substrate $S_2$, and are treated by the dummy. Other substrates are used as the product substrate $S_3$. After the dummy treatment, the PZT thin-film is formed by the film forming treatment. The stock chambers 202 on which the substrate is carried in are vacuum evacuated.

The partition valve 203 between the stock chambers 202 vacuum evacuated and the transport chamber 201 is opened, all of the transport chamber 201 and the stock chambers 202 are vacuum evacuated. For example, 1200 sccm of an adjustment gas such as $N_2$ is supplied to the transport chamber 201 from the gas source 205 to adjust the internal pressure of the transport chamber 201. The internal pressure of the transport chamber 201 is adjusted equal to about 2 Torr that is the set internal pressure of the chamber 51 or about 5% higher. After the pressure adjustment of the transport chamber 201 is almost ended, a first dummy substrate $S_2$ in the stock chambers 202 is transported to the chamber 51 via the transport chamber 201 (step 103).

In the raw material supply unit 10 as shown in FIG. 1, He is supplied from the supply line 11 for supplying He to each of the tanks A to D as shown in FIG. 1. The internal pressure in each of the tanks A to D increases, the raw material solution and the solvent of the organic metal filled in each of the tanks A to D are forced out to the supply line 12 for supplying the carrier gas. The forced droplets of the metal raw material solution and the solvent are controlled for the flow rate by a liquid flow rate controller or the like, and are transported to the vaporizer 20 by the carrier gas.

According to the embodiment, a flow rate of each raw material solution such as Pb, Zr and Ti forced out from the tanks A to C is limited to about zero by the liquid flow rate controller or the like, and only the solvent, i.e., the n-butyl acetate solution, is transported to the vaporizer 20. The flow rate of the solvent is controlled to be almost equal to that of the total of each metal raw material solution and the solvent in the film forming step.

When the film forming step is restarted, a nozzle flush of the vaporizer 20 is started by the solvent forced from the tank D. Within about 3 minutes, the vaporizer 20 is prepared to vaporize the solvent and the metal raw material solution transported later. In this case, the valve $V_2$ of the Vent line 22 is opened, a vaporized gas of the solvent and the carrier gas are discarded to the Vent line 22.

When the first dummy substrate $S_2$ is transported to the chamber 51 and is mounted on the stage 52, the dummy substrate $S_2$ is heated to 600° C. or more by the heater disposed on the stage 52. Within about 3 minutes, the temperature of the dummy substrate $S_2$ is stabilized at the predetermined temperature.

Once the temperature of the dummy substrate $S_2$ or a part such as the shower nozzle 53 in the film forming chamber 50 reaches the predetermined temperature, the valve $V_2$ of the Vent line 22 is closed and the valve $V_1$ of the Run line 21 is opened. The solvent gas vaporized by the vaporizer 20 is supplied to the mixer 30.

In the mixer 30, the vaporized gas supplied from the vaporizer 20, the oxidation gas $O_2$ and the inert gas $N_2$ are mixed at a predetermined mixing ratio (mol ratio). In this way, the gas for treating the dummy is produced. The mixing ratio is set to be about same as that of the raw material gas, the oxidation gas, and the inert gas mixed in the film forming step, for example. Also, the gas for treating the dummy may contain the inert gas used as the carrier gas.

The gas for treating the dummy produced in the mixer 30 is supplied to the chamber 51 of the film forming chamber 50 via the supply line 33. Then, the gas for treating the dummy is supplied to the dummy substrate $S_2$ heated (step 104). The gas for treating the dummy is supplied to the dummy substrate $S_2$ for the time substantially equal to the film forming time in the film forming step. In the embodiment, the PZT thin-film is formed in a thickness of about 70 nm at a film forming rate of about 15 nm/min. Accordingly, it takes about 300 seconds to form the film. However, the thickness of the PZT thin-film formed, the film forming rate, and the time for the film formation are not limited thereto.

After the supply of the gas for treating the dummy is ended, the valve $V_1$ of the Run line 21 is closed, and the valve $V_2$ of the Vent line 22 is opened. Thus, the solvent gas is discarded via the Vent line 22. Thereafter, in the embodiment, $N_2$ is supplied from the inert gas supply unit 32 connected to the mixer 30 and the internal pressure of the chamber 51 is set (about 2 Torr) to satisfy the film forming pressure conditions. Then, the first dummy substrate $S_2$ is unloaded, and a second dummy substrate $S_2$ is transported to the chamber 51. Also, the second dummy substrate $S_2$ is dummy treated as described above.

The film formation according to the embodiment requires the time (about 3 minutes) for stabilizing the temperature of the product substrate $S_3$ mounted on the stage 52, the time (about 300 seconds) for forming the film, and the time (about 60 seconds) for unloading the product substrate $S_3$ after the film formation. When these times are summed up, it takes about 10 minutes for the film formation method of one product substrate $S_3$. Accordingly, it also takes about 10 minutes for the dummy treatment of one dummy substrate $S_2$. However, the time for the film formation and the dummy treatment may be set as appropriate.

After the dummy treatment of the second dummy substrate $S_2$ is ended, the product substrate $S_3$ is transported to the chamber 51 (step 105). Together with this, the droplets of the metal raw material solution and the solvent forced by the supply line 12 for supplying the carrier gas are controlled fir the flow rate, and are transported to the vaporizer 20.

The vaporized gas of the subject metal raw material solution is produced by the vaporizer 20 and is transported to the mixer 30. In the mixer 30, the raw material gas, the oxidation gas, and the inert gas are mixed at a predetermined mixing ratio. The mixing ratio is set as appropriate in order to provide a desirable crystalline orientation of the PZT thin-film formed, for example.

The mixed gas produced in the mixer 30 is supplied to the product substrate $S_3$ disposed in the chamber 51 via the supply line 33 (step 106). In this way, the PZT thin-film is formed on the product substrate $S_3$. After the film formation, the valve $V_2$ of the Vent line 22 is opened, a vaporized gas of the metal raw material solution is discarded to the Vent line 22.

The product substrate $S_3$ on which the PZT thin-film is formed is unloaded to the transport chamber 201, a second product substrate $S_3$ is transported to the chamber 52. The film is formed on the second product substrate $S_3$ as described above. Subsequently, the product substrate $S_3$ is transported to the chamber 51, and the PZT thin-film is formed sequentially.

The reproducibility of the PZT thin-film formed by the thin-film forming apparatus 100 according to the embodiment will be described. For this, the PZT thin-film formed by the thin-film forming method according to the embodiment is compared with the PZT thin-film formed by two comparative thin-film forming methods.

Figure 4:
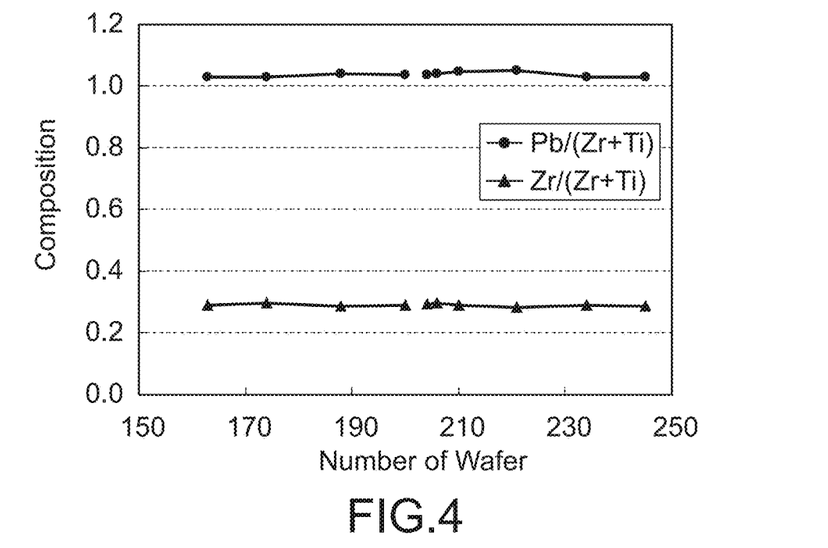
FIG. 4 A graph showing a Pb composition ratio and a Zr composition ratio in a PZT thin-film formed by a first comparative film forming method.
Figure 5:
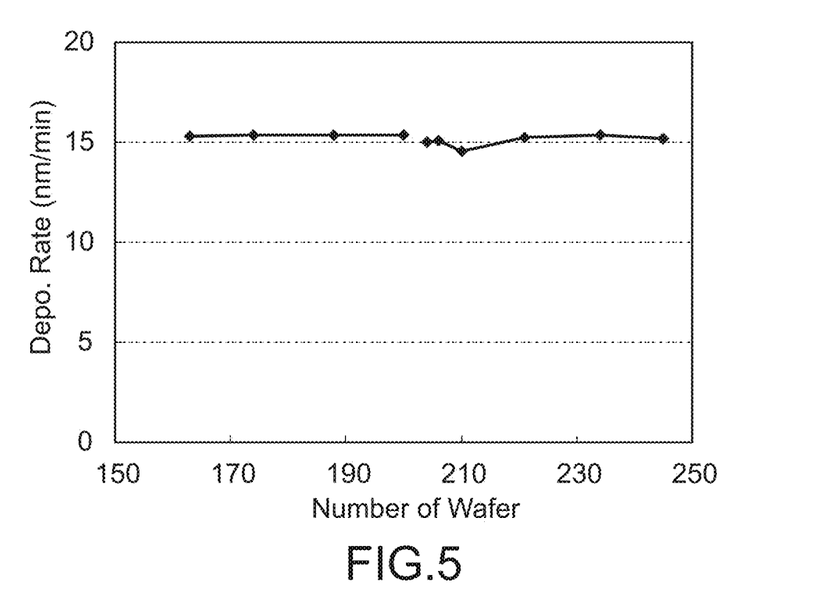
FIG. 5 A graph showing a film deposition rate according to the first comparative film forming method.
Figure 6:
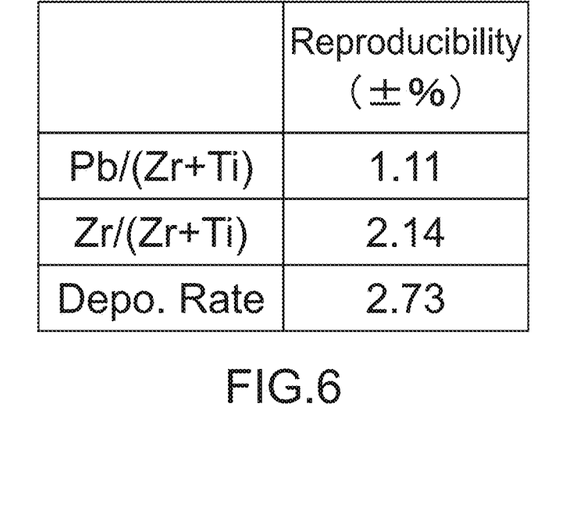
FIG. 6 A table showing a reproducibility of the Ph composition ratio, the Zr composition ratio and the film deposition rate shown in FIGS. 4 and 5.

FIGS. 4 to 6 are each a graph and a table about a first comparative thin-film forming method. FIG. 4 is a graph showing a Pb composition ratio (Pb/(Zr+ti)) and a Zr composition ratio (Zr/(Zr+Ti)) in a PZT thin-film. FIG. 5 is a graph showing a film deposition rate (nm/min) according to the first comparative film forming method. FIG. 6 is a table showing a reproducibility of the Pb composition ratio, the Zr composition ratio and the film deposition rate shown in FIGS. 4 and 5.

According to the first comparative film forming method, the chamber is idled where the idle substrate is not disposed. When the film formation is restarted, two dummy substrates are firstly treated. In the dummy treatment according to the first comparative film forming method, the raw material gas supplied to the product substrate is also supplied to the dummy substrate, thereby forming the PZT thin-film on the dummy substrate.

According to the first comparative film forming method, the films are sequentially formed on 200 product substrates. After about 6 hours of the idling, the film formation is restarted. In FIGS. 4 and 5, 50 product substrates ($150^{th}$ to $200^{th}$ in the graphs) before the idling and 50 product substrates ($201^{th}$ to $250^{th}$, in fact from the third substrate after the restart) after restarting the film formation excluding the dummy substrates ($201^{th}$ to $203^{th}$) are measured. Respective measured values of the predetermined number of the product substrates selected from the range are shown. As shown in FIGS. 4 and 5, many product substrates immediately after the dummy treatment are selected.

A reproducibility in FIG. 6 shows a variation of the respective measured values as shown in FIGS. 4 and 5. Specifically, the respective measured values are shown in ±% by dividing a difference between the maximum value and the minimum value by a sum of the maximum value and the minimum value.

Figure 7:
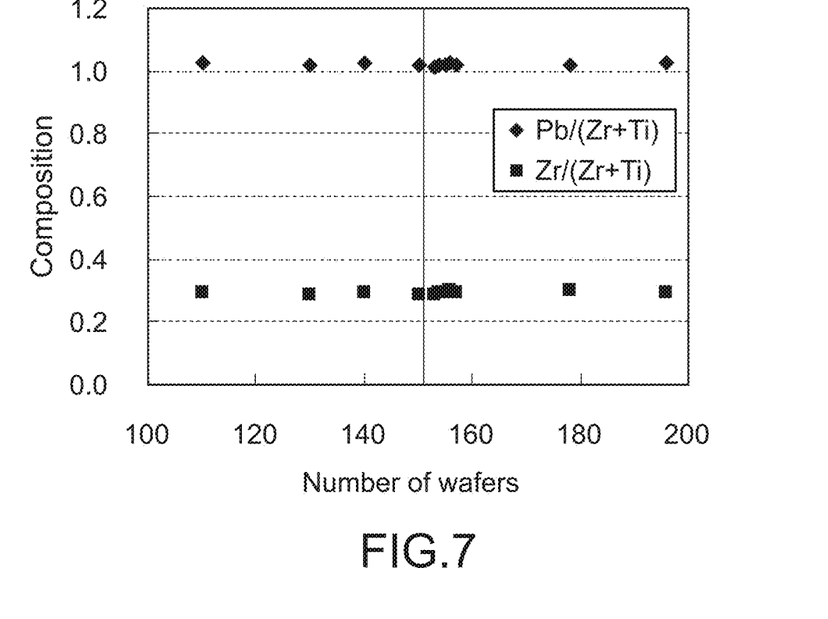
FIG. 7 A graph showing a Ph composition ratio and a Zr composition ratio in a PZT thin-film formed by a second comparative film forming method.
Figure 8:
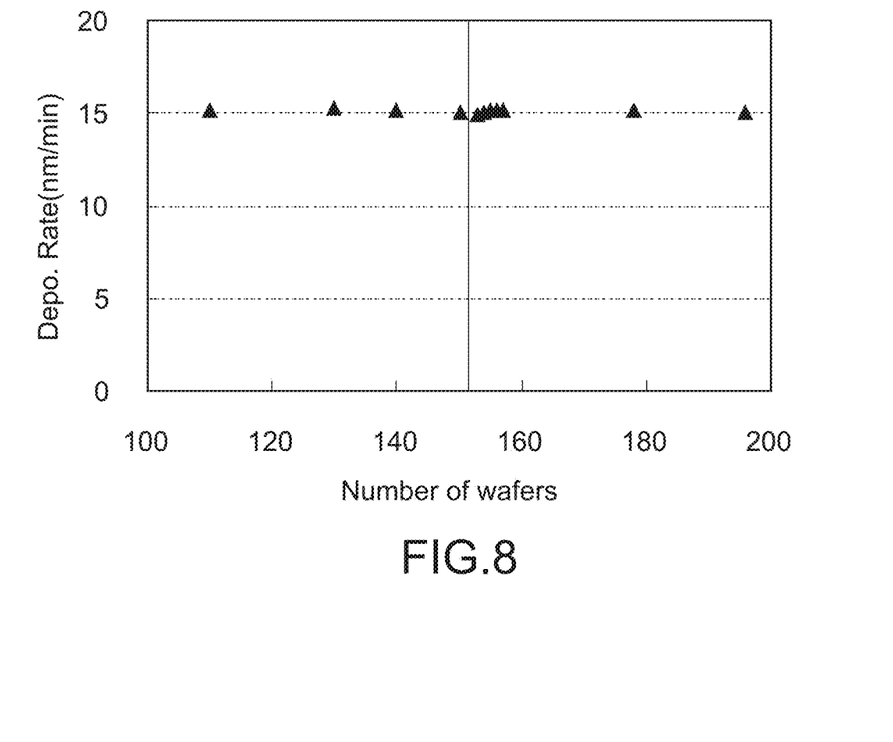
FIG. 8 A graph showing a film deposition rate according to the second comparative film forming method.
Figure 9:
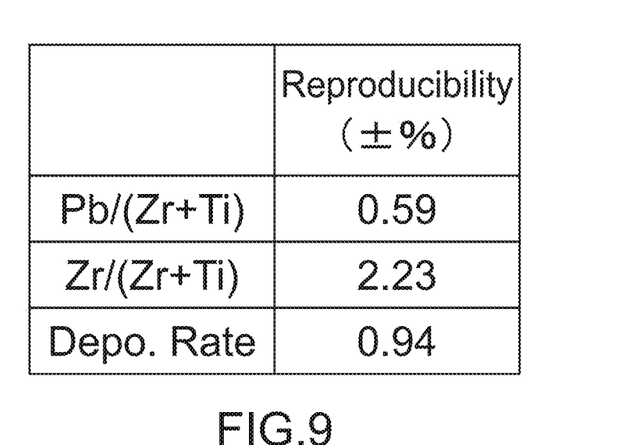
FIG. 9 A table showing a reproducibility of the Pb composition ratio, the Zr composition ratio and the film deposition rate shown in FIGS. 7 and 8.

FIGS. 7 to 9 are graphs and a table about a second comparative film forming method. FIG. 7 is a graph showing a Pb composition ratio and a Zr composition ratio in a PZT thin-film. FIG. 8 is a graph showing a film rate. FIG. 9 is a table showing a reproducibility of the Pb composition ratio, the Zr composition ratio and the film deposition rate shown in FIGS. 7 and 8.

According to the second comparative film forming method, the chamber is idled where the idle substrate is disposed. When the film formation is restarted, two dummy substrates are firstly treated using the raw material gas. In the dummy treatment according to the second comparative film forming method, as in the dummy treatment according to the first comparative film forming method, the PZT thin-film is formed on the dummy substrate.

According to the second comparative film forming method, the films are sequentially formed on 150 product substrates. After about 6 hours of the idling using the idle substrates, the film formation is restarted. In FIGS. 7 and 8, 50 product substrates before the idling and 50 product substrates after the idling excluding the dummy substrates are measured. Respective measured values of the predetermined number of the product substrates selected from the range are shown. As shown in FIGS. 7 and 8, the measured values of 5 product substrates sequentially formed immediately after the dummy treatment are shown.

When the first comparative film forming method as shown in FIGS. 4 to 6 is compared with the second comparative film forming method as shown in FIGS. 7 to 9, it can be found that the reproducibilities of the respective measured values according to the second comparative film forming method are better. As described above, in the second comparative film forming method, the chamber is idled where the idle substrate is disposed. In this way, under the idling, the temperature environment of the chamber is adjusted to approach the temperature environment where the film forming conditions are satisfied. Therefore, it is considered that the reproducibilities of the respective measured values are improved.

Figure 10:
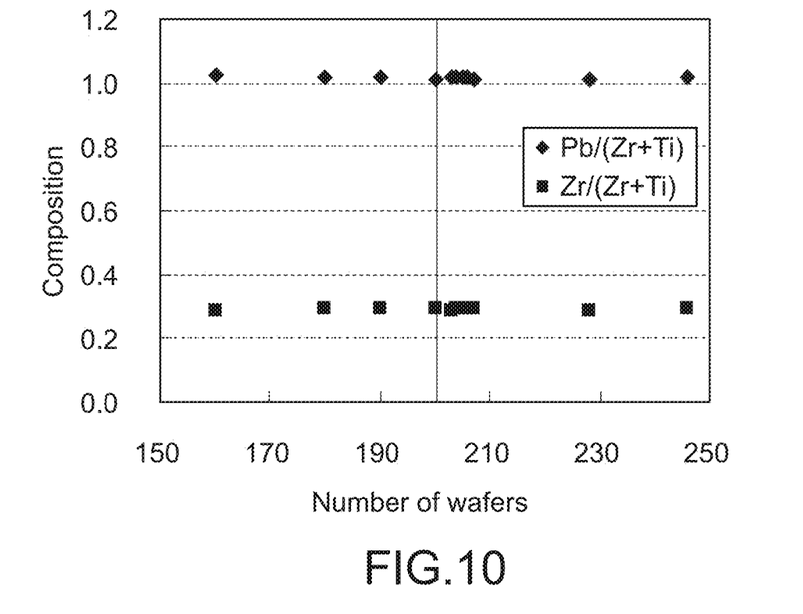
FIG. 10 A graph showing a Pb composition ratio and a Zr composition ratio in a PZT thin-film formed by the thin-film forming method according to the embodiment of the present invention.
Figure 11:
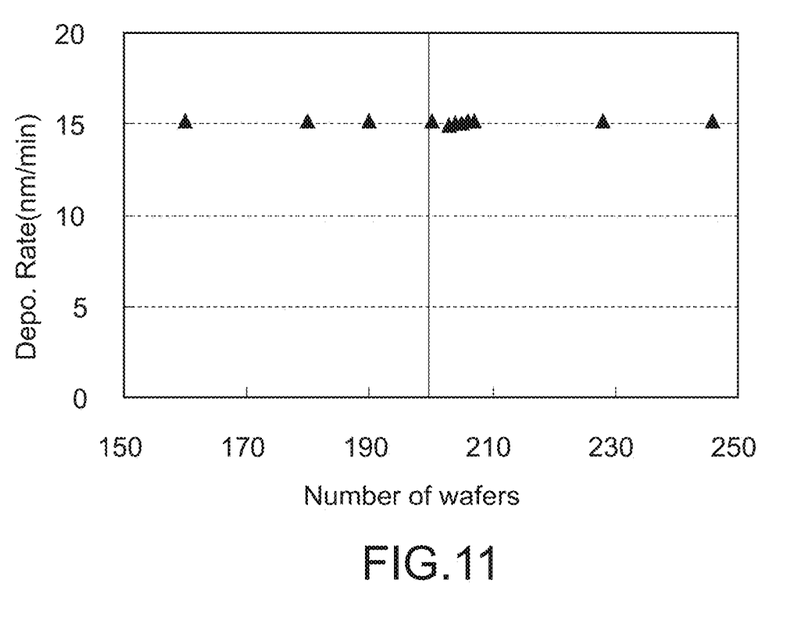
FIG. 11 A graph showing a film deposition rate of the thin-film forming method according to the embodiment of the present invention.
Figure 12:
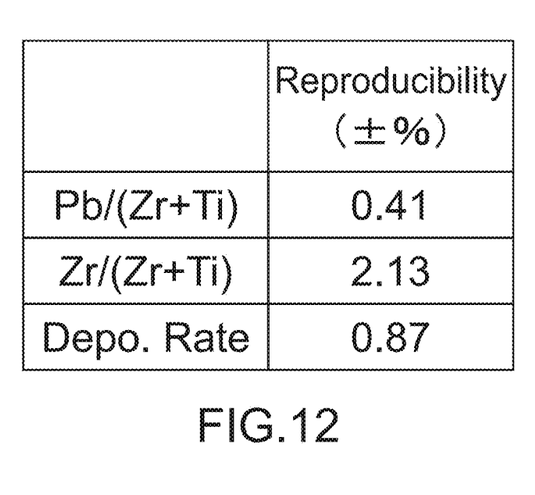
FIG. 12 A table showing a reproducibility of the Pb composition ratio, the Zr composition ratio and the film deposition rate shown in FIGS. 10 and 11.

FIGS. 10 to 12 are graphs and a table as to the film forming method according to the embodiment. FIG. 10 is a graph showing a Pb composition ratio and a Zr composition ratio. FIG. 11 is a graph showing a film deposition rate. FIG. 12 is a table showing a reproducibility of the Pb composition ratio, the Zr composition ratio and the film deposition rate shown in FIGS. 10 and 11.

Here, the films are sequentially formed on 150 product substrates $S_3$. After about 6 hours of the idling using the idle substrates $S_1$, the film formation is restarted and the dummy is treated. As described above, in the dummy treatment according to the embodiment, the dummy substrate $S_2$ is supplied with the gas for treating the dummy containing no metal raw materials.

In FIGS. 10 and 11, 50 product substrates $S_3$ before the idling and 50 product substrates $S_3$ after the idling excluding the dummy substrates $S_2$ are measured. Respective measured values of the predetermined number of the product substrates $S_3$ selected from the range are shown. As shown in FIGS. 10 and 11, the measured values of 5 product substrates $S_3$ sequentially formed immediately after the dummy treatment are shown.

When the second comparative film forming method as shown in FIGS. 7 to 9 is compared with the film forming method according to the embodiment as shown in FIGS. 10 to 12, the respective measured values and the reproducibilities are almost same. In other words, even if the PZT thin-film is not formed on the dummy substrate $S_2$ in the dummy treatment, it can be found that the reproducibilities of the Pb composition ratio, the Zr composition ratio and the film deposition rate are good.

The present inventors of the present application have been considered the film forming reproducibility of the film formation restarted after the idling as follows: First, while the idle substrate $S_1$ is disposed in the chamber 51, the chamber 51 is idled. In this way, under the idling, the temperature environment of the chamber 51 can approach the temperature environment where the film forming conditions are satisfied.

Next, it is observed a change in the environment of the chamber 51 when the film formation is restarted from the idling. As described above, in the film formation, the product substrate S3 is transported to the chamber 51 at a time interval of about 10 minutes. The present inventors have focused on a temperature environment change in the chamber 51 caused by the transport operation. Then, the dummy treatment is examined to satisfy the film forming temperature environment in the chamber 51. As a result, it is found that the temperature environment in the chamber 51 can be adjusted even if the gas for treating the dummy supplied to the dummy substrate $S_2$ contains no metal raw materials. As shown in FIGS. 10 to 12, it reveals that the film forming reproducibility of the film formation after the idling is good even if the dummy is treated with the gas containing no metal raw materials.

According to the thin-film forming apparatus 100 according to the embodiment and the method of forming a thin-film by the apparatus 100, while the idle substrate $S_1$ is disposed in the chamber 51, the chamber 51 is idled. In this way, the environment of the chamber 51 can approach the environment where the film forming conditions are satisfied. Before the raw material gas containing the metal raw material is supplied to the product substrate $S_3$, the gas for treating the dummy which is different from the raw material gas is supplied to the dummy substrate $S_2$. It is thus possible to satisfy the film forming environment in the chamber 51.

According to the embodiment, as the gas for treating the dummy, the mixed gas is used; the mixed gas being obtained by mixing the solvent gas, the reaction gas used in the film forming method and the inert gas. In other words, the gas for treating the dummy contains no metal raw materials. A consumption amount of each metal raw material can be decreased. Therefore, the PZT thin-film can be formed by saving the resources with good reproducibility at low costs.

For example, when films are sequentially formed on 100 substrates after the idling, the first two substrates are the dummy substrates $S_2$, thereby reducing the costs for the metal raw materials by 2% as compared with the first and second comparative thin-film forming methods. In practice, less than 100 films are formed because of confirmation of the conditions, a routine maintenance of the apparatus and the like. In this case, the effect of reducing the cost of the metal raw material becomes greater.

The present invention is not limited to the above-described embodiments, and variations and modifications may be made without departing from the scope of the present invention.

According to the embodiment, as the gas for treating the dummy, the mixed gas is used; the mixed gas being obtained by mixing the solvent gas, the reaction gas used in the film forming method and the inert gas. However, as the gas for treating the dummy, the mixed gas of the solvent gas and the inert gas, the mixed gas of the solvent gas and the oxidation gas, or the mixed gas of the oxidation gas and the inert gas may be used. Alternatively, in the dummy treatment, the solvent gas may not be supplied to the mixer 30, and only the inert gas from the inert gas supply unit 32 connected to the mixer 30 may be used as the gas for treating the dummy. Also, only the oxidation gas from the oxidation gas supply unit 31 connected to the mixer 30 may be used. In addition, the solvent gas supplied to the mixer 30 may be not mixed with the oxidation gas or the inert gas, and may be used alone as the gas for treating the dummy.

Figure 13:
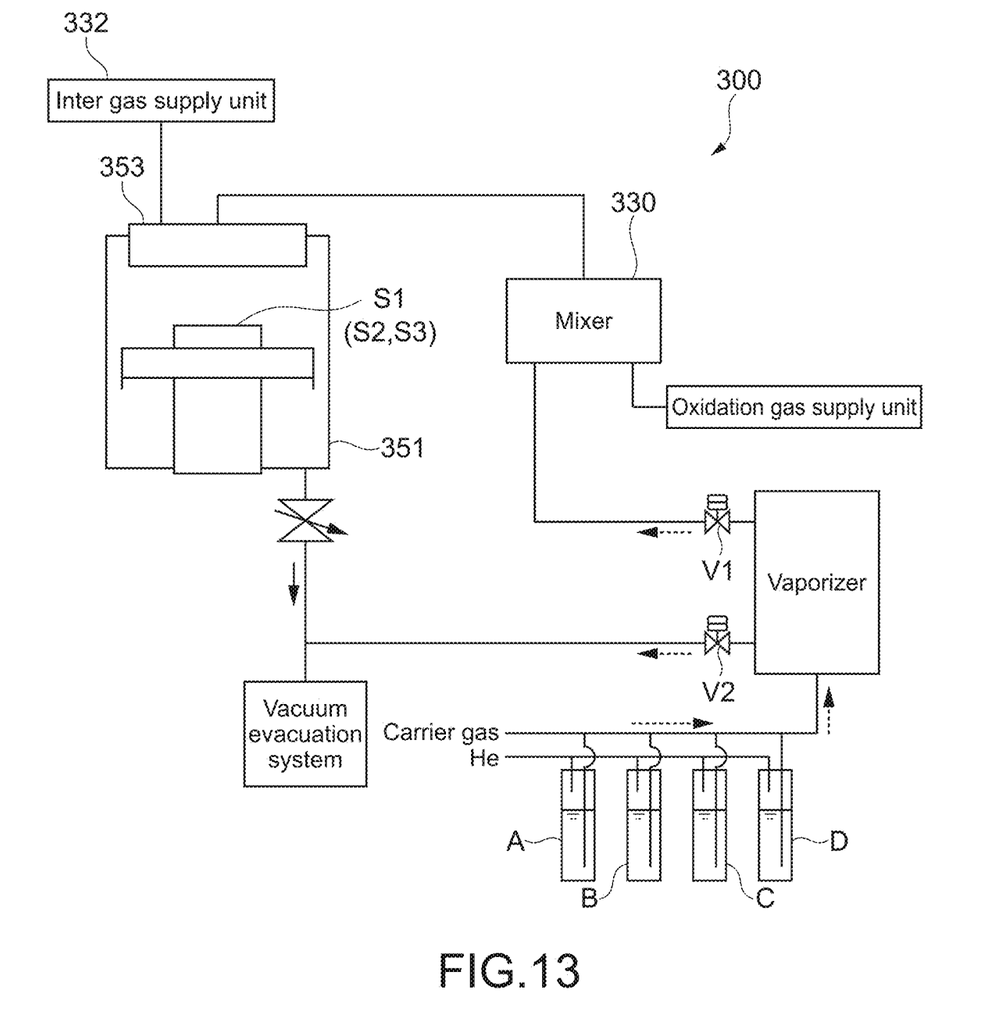
FIG. 13 A schematic diagram showing a modification of the thin-film forming apparatus shown in FIG. 1.

FIG. 13 is a schematic diagram showing a modification of the thin-film forming apparatus 100 shown in FIG. 1. In a thin-film forming apparatus 300, an inter gas supply unit 332 is not connected to a mixer 330, and is separately connected to a shower nozzle 353 of a chamber 351. In the film forming step, the raw material gas is mixed with the oxidation gas by the mixer 330, and the mixed gas is supplied to the product substrate $S_3$. In this way, the PZT thin-film is formed on the product substrate $S_3$. In the thin-film forming apparatus 300 having such a configuration, the mixed gas of either of the solvent gas, the oxidation gas, and the inert gas may be used as the gas for treating the dummy. Alternatively, each gas may be used alone as the gas for treating the dummy. When the inert gas is mixed, it will be mixed in the chamber 351.

Also, the mixer may not be disposed, and the raw material gas, the oxidation gas supply unit and the inert gas supply unit may be individually connected to the chamber. In this case, the mixed gas of the raw material gas, the oxidation gas, and the inert gas will be produced in the chamber. In such a configuration, each of the mixed gases as described above may be used as the gas for treating the dummy.

In the above embodiments, two dummy substrates $S_2$ are used in the dummy treatment. However, one dummy substrate $S_2$ may be transported to the chamber twice. In the embodiments, one dummy substrate $S_2$ can be advantageously used, because the PZT thin-film is not formed on the dummy substrate $S_2$. In addition, the dummy substrate $S_2$ and the product substrate $S_3$ may be not the same substrate. For example, the substrate dedicated for the dummy is prepared, and the substrate may be used repeatedly in the dummy treatment.

The number and the frequency of the dummy substrate used are not limited to two, and can be set as appropriate. As long as the temperature environment and the film forming conditions in the chamber are satisfied, one dummy substrate is used one time for treating the dummy.

The dummy substrate may be used as the idle substrate. For example, the idle substrate is carried out from the idled chamber, and is carried in again to the chamber. Then, the gas for treating the dummy may be supplied to the idle substrate.

According to the above-described embodiment, the PZT thin-film is formed using the thin-film forming apparatus 100.

However, the present invention is applicable to the formation of the thin-film other than the PZT thin-film by the MOCVD method. Examples include the thin-film of lanthanum-doped lead zirconate titanate ((Pb, La)(Zr, Ti)$O_3$; PLZT), strontium bismuth tantalite ($SrBi_2$, $Ta_2$, $O_9$; SBT) and the like. Also, examples include the thin-film of gallium nitride (GaN), indium gallium nitride (InGaN), zinc sulfide (ZnS) and the like.

As the reaction gas for used in the film formation by the MOCVD method, a reducing gas such as ammonia ($NH_3$) may be used. In this case, as the gas for treating the dummy, the mixed gas containing any of the solvent gas, the reducing gas, and the inert gas may be used, or each gas may be used alone.

As the thin-film forming apparatus 100 according to the embodiment of the present invention, the multichamber film forming apparatus 200 is illustrated above, as shown in FIG. 2. However, the thin-film forming apparatus 100 of the embodiment may be disposed on a substrate processing apparatus including a plurality of process apparatuses such as an etching process apparatus and a cleaning process apparatus. Examples of the substrate process apparatus include a cluster tool type substrate process apparatus and an in-line type substrate process apparatus.

According to the above-described embodiment, the chamber is idled before the dummy substrate $S_2$ is carried in to the chamber and the gas for treating the dummy is supplied. However, the present technology may not require the step of idling the chamber.

DESCRIPTION OF SYMBOLS $S_1$ idle substrate
$S_2$ dummy substrate
$S_3$ product substrate
51, 351 chamber
100, 300 thin-film forming apparatus
200 multichamber film forming apparatus

The invention claimed is:

1. A method of forming a thin-film, comprising:
    transporting a dummy substrate to a chamber;
    supplying the dummy substrate with a gas for treating a dummy, the gas for treating the dummy containing a solvent gas for dissolving a metal raw material and containing no raw material gas containing the metal raw material;
    transporting a product substrate to the chamber; and
    supplying the product substrate with a raw material gas containing a metal raw material for forming a thin-film by a metal organic chemical vapor deposition method, wherein the gas for treating the dummy is constituted to be different from the raw material gas such that conditions of the chamber are adjusted to be ready for the forming of the thin-film by the metal organic chemical vapor deposition method.

2. The method of forming a thin-film according to claim 1, wherein in the step of supplying the raw material gas, the product substrate is supplied with a mixed gas of the raw material gas, a reaction gas for reacting with the raw material gas, and an inert gas.

3. The method of forming a thin-film according to claim 2, wherein the gas for treating the dummy is provided by mixing the solvent gas for dissolving the metal raw material, the reaction gas, and the inert gas.

4. The method of forming a thin-film according to claim 2, wherein the gas for treating the dummy is obtained by mixing the solvent gas for dissolving the metal raw material with the inert gas.

5. The method of forming a thin-film according to claim 2, wherein the gas for treating the dummy is the inert gas.

6. The method of forming a thin-film according to claim 1, wherein in the step of supplying the raw material gas, the product substrate is supplied with a mixed gas of the raw material gas, and a reaction gas for reacting with the raw material gas.

7. The method of forming a thin-film according to claim 6, wherein the gas for treating the dummy is a mixed gas provided by mixing the solvent gas for dissolving the metal raw material, and the reaction gas.

8. The method of forming a thin-film according to claim 6, wherein the gas for treating the dummy is the reaction gas.

* * * * *